United States Patent [19]
Hayashi et al.

[11] Patent Number: 5,629,919
[45] Date of Patent: May 13, 1997

[54] TWO PLATE-LIKE BEAM SPLITTING DEVICE

[75] Inventors: Takao Hayashi; Toru Nakamura, both of Katano; Hideki Aiko, Higashi-Osaka; Akira Matsubara, Kameoka, all of Japan

[73] Assignee: Matsushita Electric Industrial Co., Ltd., Osaka, Japan

[21] Appl. No.: 429,877

[22] Filed: Apr. 27, 1995

[51] Int. Cl.⁶ .................................................. G11B 7/00
[52] U.S. Cl. .......................... 369/112; 369/103; 369/109; 369/110; 369/44.14
[58] Field of Search .................................. 369/13, 44.37, 369/103, 109, 110, 112, 44.23, 44.14

[56] References Cited

U.S. PATENT DOCUMENTS

| | | | |
|---|---|---|---|
| 4,771,414 | 9/1988 | Yoshimatsu | 360/110 |
| 4,794,585 | 12/1988 | Lee | 369/112 |
| 5,231,620 | 7/1993 | Ohuchida | 369/109 |
| 5,428,584 | 6/1995 | Yoshida et al. | 369/112 |

FOREIGN PATENT DOCUMENTS

| | | |
|---|---|---|
| 0452793A2 | 10/1991 | European Pat. Off. . |
| 0534373A2 | 3/1993 | European Pat. Off. . |
| 0581597A2 | 2/1994 | European Pat. Off. . |
| 0605929A1 | 7/1994 | European Pat. Off. . |
| 0631279A2 | 12/1994 | European Pat. Off. . |
| 2256725 | 12/1992 | United Kingdom . |

*Primary Examiner*—Georgia Y. Epps
*Assistant Examiner*—Kim-Kwok Chu
*Attorney, Agent, or Firm*—McDermott, Will & Emery

[57] ABSTRACT

In an optical head, a light emitting element emits an optical beam, and the beam is condensed by a condensing element onto an information recording medium. A first plate beam-splitting element has a splitting ratio of P polarization to S polarization, and it splits at least a part of the beam reflected by the information recording medium along a direction different from that of a direction returning to the light emitting element. A second plate beam-splitting element is provided in parallel to the first plate beam-splitting element, and it splits the beam split by the first plate beam-splitting element into at least two beams having polarization planes perpendicular to each other. The two beams are detected by a pair of photosensors. Because the first and second beam-splitting elements are set in parallel to each other, an optical path from the light emitting element to the information recording medium is separated from that of a reflected beam from the medium with a very small angle, and the optical elements can be located at adjacent positions to each other. Thus, the optical head can be made compact to a large extent. Further, the optical head can be sealed for high reliability.

12 Claims, 7 Drawing Sheets

TWO PLATE-LIKE BEAM SPLITTING DEVICE

BACKGROUND OF THE INVENTION

1. Field of the Invention

The present invention relates to an optical head for an optical recording and reproducing apparatus for recording, reproducing and erasing signals with an optical beam by using a magnetooptical effect, the optical head being used for acoustic and video files, document files and external storage device.

2. Description of the Prior Art

Recently, a so-called optical recording and reproducing apparatus using a magnetooptical effect has attracted attention as an apparatus for recording, reproducing and erasing signals repeatedly. An optical head is a basic component of the apparatus which is considered most important technically.

A principle of optical recording, reproducing and erasing is explained here. An information recording medium for an optical recording and reproducing apparatus usually comprises an amorphous film of a rare earth and transition metal system having a vertical anisotropy. A light emitting element is a light source for emitting a linearly polarized light such as a laser diode. On recording, a beam from the light emitting element radiates onto the information recording medium and the temperature increases above the Curie temperature to lose magnetism, and the medium is magnetized along a direction of an applied external magnetic bias field. On reproduction, a direction of polarization of the linearly polarized light is rotated by 0.3°–0.5° left or right according to the direction of magnetization at the surface of the medium due to the magnetooptical effect, and the direction of the rotation is detected to pick up signals. On erasing, a beam from the light source radiates the medium similarly on recording while an external magnetic bias field is applied along a direction opposite to that on recording.

An optical head for the optical recording and reproducing apparatus needs two polarization separation functions. One of them is that the linearly polarized light emitted by the light-emitting element is irradiated efficiently onto an information recording medium while separating a reflecting light including a light with a rotated polarization from the medium from the radiating light to the medium. The other is that the reflected light from the medium is separated into at least two polarization components perpendicular to each other so as to be detected separately in order to detect the direction of the rotation of only 0.3°–0.5°.

An optical head having such functions is disclosed for example in U.S. Pat. No. 4,771,414, wherein a polarization beam splitter is used for splitting a light from a light emitting element to an information recording medium and a light reflected from the medium. The polarization beam splitter comprises two prisms adhered to each other and films for separating polarizations are formed at the adhered plane for transmitting P polarization while reflecting S polarization. Then, for example, a linearly polarized light of S polarization is reflected efficiently to radiate an information recording medium, while transmitting P polarization component included in the reflected light.

Further, a polarizer is used in order to split the reflected light into at least two polarization components perpendicular to each other. The polarizer also comprises two quartz prisms adhered to each other, so as to make optical axes thereof 45° each other, so that a polarization plane of the reflected light from the medium has ° relative to the optical axis of the plane of the polarizer through which the reflected light enters. Then, the reflected light of P polarization from the medium is split by the polarizer into three beams of P polarization component, S polarization component, and a synthesized component of the P and S polarization components. Then, the S and P polarization components are detected separately and a difference between them is obtained to detect an information signal in the medium.

However, such an optical head is difficult to be made compactly. The beam splitter and the polarizer used for the two beam separation functions both comprise two prisms. Thus, a number of optical components is large, and assemblage processes therefor are needed. Further, volumes thereof are large. Further, a cost of the polarizer is large because quartz prisms are needed. Still further, optical components such as the light emitting element, the polarization separation elements and photosensors need to be located separately, and this requires many adjustment steps.

SUMMARY OF THE INVENTION

An object of the present invention is to provide a compact optical head.

Another object of the present invention is to provide an optical head which can be constructed easily.

In an optical head of the present invention, a light emitting element emits an optical beam, and the beam is condensed by a condensing element onto an information recording medium. A first plate beam-splitting element has a splitting ratio of P polarization to S polarization, and it splits at least a part of the beam reflected by the information recording medium along a direction different from that of a direction returning to the light emitting element. A second plate beam-splitting element is provided in parallel to the first plate beam-splitting element, and it splits the beam split by the first plate beam-splitting element into at least two beams having polarization planes perpendicular to each other. A pair of photosensors detects beams from the second plate beam-splitting element. Because the first and second beam-splitting elements are set in parallel to each other, an optical path from the light emitting element to the information recording medium is separated from that of a reflected beam from the medium with a very small angle, and the optical elements can be located at adjacent positions to each other. Thus, the optical head can be made compact to a large extent. Further, the optical head can be sealed for high reliability. The second beam splitting element may be set so as not to be located along a path of the beam emitted from the light emitting element. The first and second beam splitting element can be integrated as one body.

An advantage of the present invention is that a magnetic head has a compact size.

Another advantage of the present invention is that it can be constructed easily and at a low cost.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
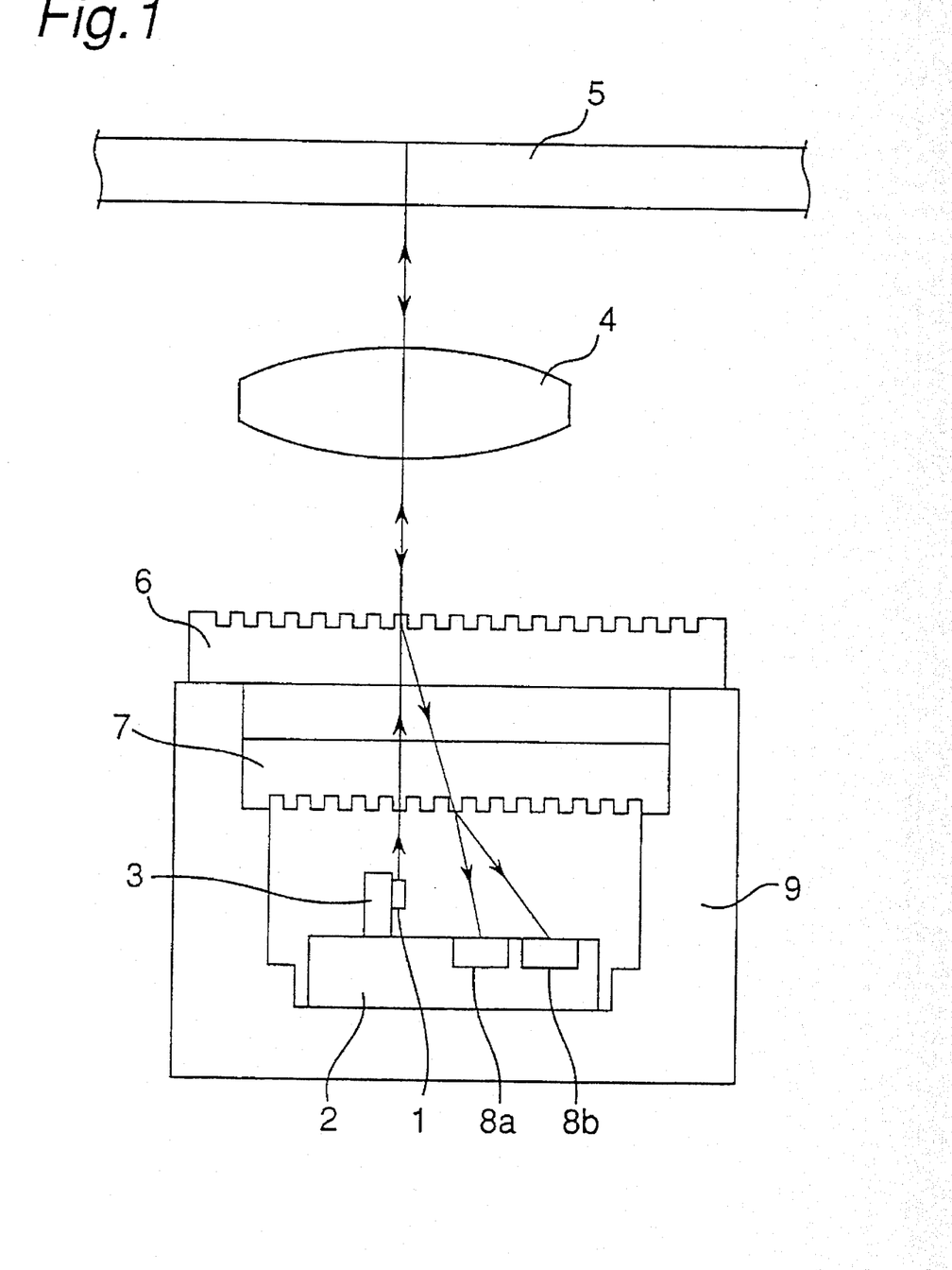
FIG. 1 is a sectional view of an optical head of a first embodiment of the invention.

Referring now to the drawings, wherein like reference characters designate like or corresponding parts throughout the several views, FIG. 1 shows an optical head of a first embodiment of the invention. A laser diode 1 is mounted to a stem 3 fixed to a substrate 2, and it is a light emitting element for emitting a linearly polarized light. An object lens 4 as a condensing element condenses the light emitted by the laser diode 1 onto an information recording medium 5 such as an optical disk. A first plate beam-splitting element 6 is a hologram diffraction element provided between the substrate 2 and the object lens 4. The element 6 is produced by etching a transparent plate made of an optically anisotropic material so as to form grooves like a grating. The laser diode 1 is set so that when the beam emitted by the laser diode 1 transmits a second plate beam-splitting element 7 first, the linear polarization of the transmitting beam is S polarization. The beam emitted by the laser diode 1 transmits the first plate beam-splitting element 6 perpendicularly and the object lens 4. The beam is reflected by the information recording medium 5 which is set in parallel to the first plate beam-splitting element 6 and returns through the object lens 4 again to reach the first plate beam-splitting element 6. The element 6 splits a part of the returned beam along a direction different by a very small angle from that of the beam returning to the laser diode 1, as shown schematically in FIG. 1. A second plate beam-splitting element 7 is a hologram diffraction element provided between the first one 6 and the substrate 2 in parallel approximately to the first one 6. The second plate beam-splitting element 7 is also produced by etching a transparent plate made of an optically anisotropic material so as to form grooves like a grating. The second plate beam-splitting element 7 splits the returned beam split by the first one 6 into two beams having polarization planes perpendicular to each other and inclined by 45° to the polarization direction of the beam split by the first one 6, as shown schematically in FIG. 1. A pair of photosensors 8a and 8b are formed in the substrate 2 and they detects the two beams split by the second element 7. A housing 9 encloses the substrate 2 and the second element 7 and it is sealed by the first element 6.

A basic operation of the optical head is explained for example on reproducing signals. The linearly polarized light emitted from the laser diode 1 transmits first the second plane beam-splitting element 7 to become a linearly polarized light of S polarization and to be guided to the first plate beam-splitting element 6. The first element 6 diffracts a part of the transmitted beam, while the remaining of the beam is lead to the object lens 4 to be condensed onto the information recording medium 5. On the medium 5, the polarization direction of the light of the S polarization is polarized by about 0.3°–0.5° left or right according to the direction of the magnetization or an information signal due to magnetooptical effect to generate P polarization including the information signal. The reflecting light including the P polarization transmits again the object lens 4 to return to the first plate beam-splitting element 6. Then, a part of the returned beam is split by the first element 6 by a very small angle along a direction different from that to the laser diode 1. As to the reproduction of magnetooptical signals, it is considered that a quality of reproduced signals is better if P and S polarizations are mixed by a suitable ratio. Therefore, the first plate beam-splitting element 6 is produced to have a different splitting ratio between the S and P polarizations in order to mix them suitably and to improve an efficiency to guide the beam emitted by the laser diode 1 onto the medium 5. The reflected beam split by the first plate beam-splitting element 6 including P polarization is lead to the second element 7. The returned beam is split by the second element 7 into two beams having polarization planes perpendicular to each other and inclined by 45° to the polarization direction of the returned beam split by the first element 6 and it is guided to a pair of the photodetectors 8a and 8b. Then, a difference of the beams detected by the photodetectors 8a and 8b is obtained in order to detect the rotation direction of the polarization plane of the linearly polarized light in correspondence to the magnetization direction on the information recording medium 5 or to detect information signals.

In the optical head explained above, a number of the optical components can be reduced largely, and steps for producing it also can be decreased largely. Further, components can be placed near each other to be integrated as one body. Thus, the optical head can be made compact thin and light. Further, because the laser diode 1 and a pair of the photodetectors 8a and 8b can be sealed against environment, so that reliability and durability of the optical head can be improved.

In the above-mentioned head, S polarization is condensed onto the medium 5. However, as will be understood easily by a person skilled in the art, the roles of the S and P polarizations can be reversed.

Figure 2:
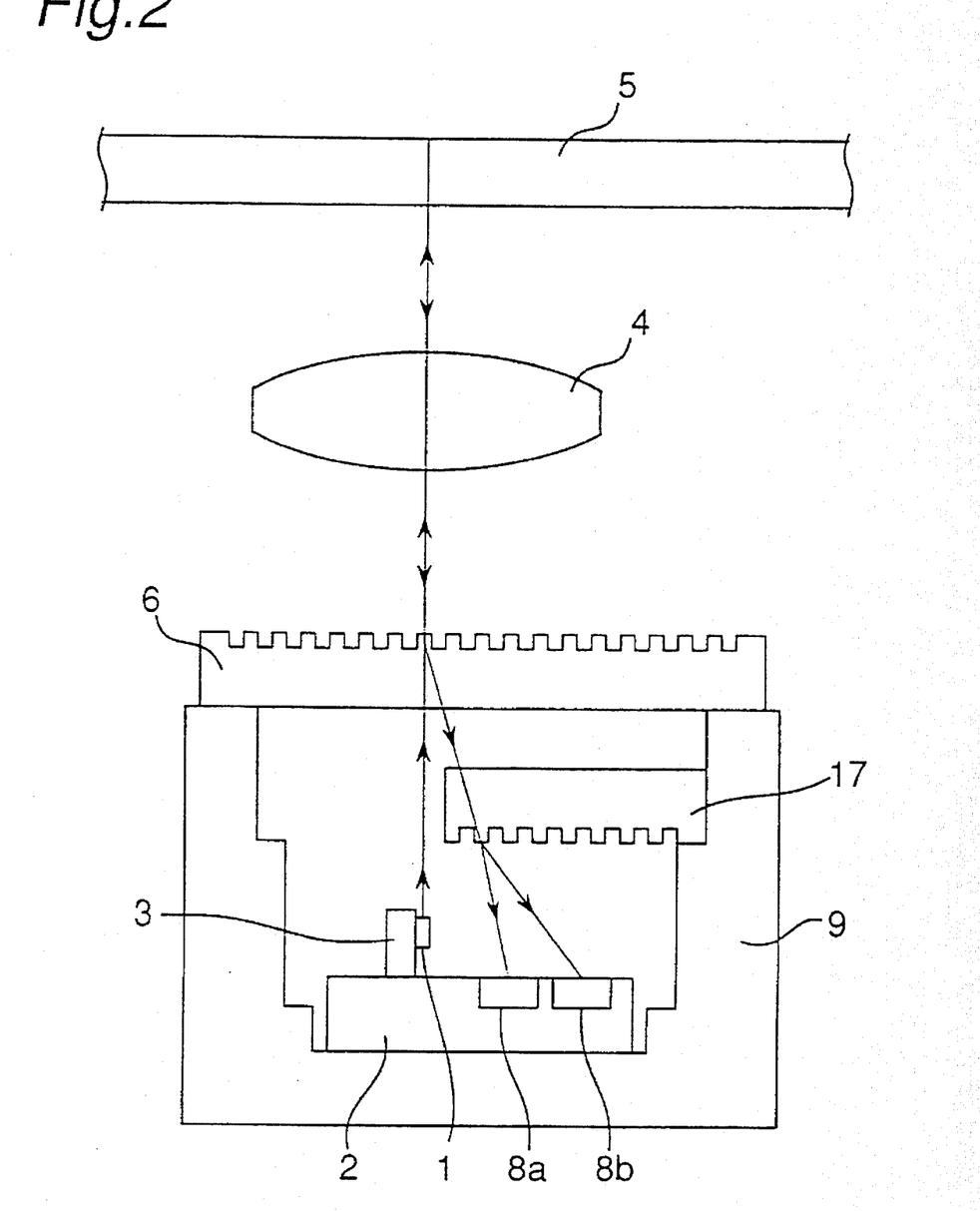
FIG. 2 is a sectional view of an optical head of a second embodiment of the invention.

Other embodiments of the invention are explained with reference to FIGS. 2–7. First, FIG. 2 shows an optical head of a second embodiment of the invention. The optical head of the embodiment is different from that of the first embodiment only in that a plate beam-splitting element 17 is used instead of the second plate beam-splitting element 7. The plate beam-splitting element 17 is similar to the second plate beam-splitting element 7, but it has a different size. That is, the element 17 is provided so that the beam emitted from the laser diode 1 does not transmit the element 17, but enters directly into the first plate beam-splitting element 6. On the other hand, the returned beam split by the first plate beam-splitting element 6 transmits the element 17. Similarly to the second plate beam-splitting element 7, the element 17 splits the returned beam into two beams having polarization planes perpendicular to each other and inclined by 45° to the polarization direction of the returned beam split by the first element 6 and it is guided to a pair of the photodetectors 8a and 8b.

Similarly to the optical head of the first embodiment, the optical head of this embodiment also had advantages such as compactness, high reliability and durability and easy production thereof. Further, because the beam from the laser diode 1 does not transmit the element 17, disadvantages such as a loss of a quantity of light and deterioration of aberration do not occur, and recording and erasing can be performed precisely. On reproduction, the rotation of polarization plane due to magnetooptical effect can be detected better, and information signals can be detected surely. Further, a stray light due to random reflection of a part of the beam can be decreased. Therefore, noises due to stray light can be decreased to improve precision of information signals.

Figure 3:
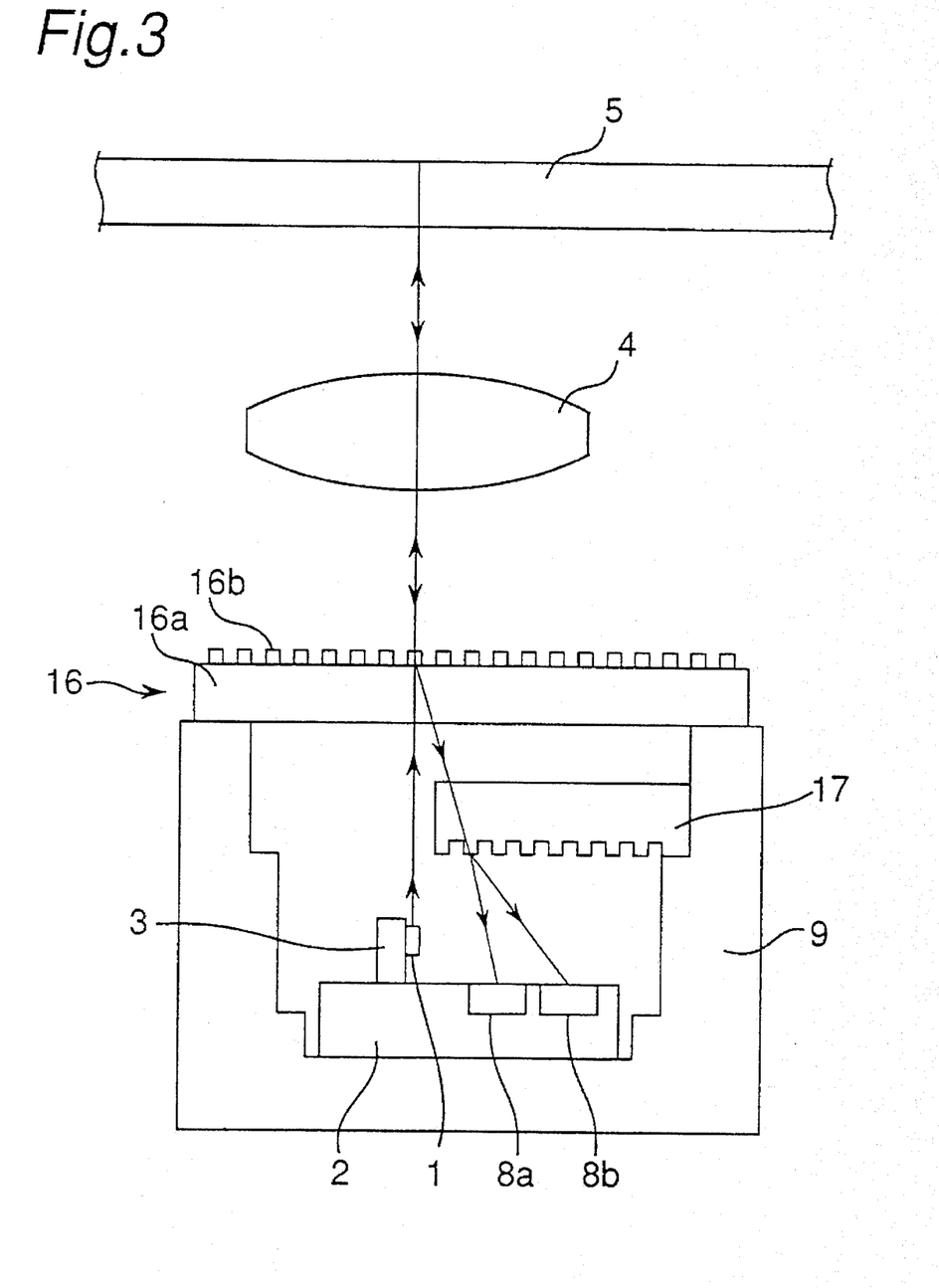
FIG. 3 is a sectional view of an optical head of a third embodiment of the invention.

FIG. 3 shows an optical head of a third embodiment of the invention. The optical head of the embodiment is different from that of the first embodiment only in that a plate beam-splitting element 16 including a film 16b for separating polarizations is used instead of the first plate beam-splitting element 6. The film 16b for separating polarizations of the element 16 is made of an optically anisotropic film deposited on a plane of a transparent plate 16a and has a shape similar to a grating. It has splitting ratios different between S and P polarizations similarly to the first plate beam-splitting element 6, and it has the same function as the plate 6. That is, a part of the beam emitted by a laser diode 1 transmits through an object lens 4 and the beam reflected by an information recording medium 5 and transmitting the object lens 4 again is split by the beam-splitting element 16 along a direction different by a very small angle from that of the beam returning to the laser diode 1.

A basic operation as the optical head is similar to that of the first embodiment, and detail explanation thereof is omitted here. Similarly to the first and second embodiments, the optical head of this embodiment also have advantages such as compactness, high reliability and durability, easy production thereof and improvement of recording, reproducing and erasing performance. Further, because the plate beam-splitting element 16 comprises the film 16b for separating polarizations, it can be produced at a low cost. Because the film 16b is produced with deposition process which has high precision, performance of beam splitting, aberration and the like becomes very stable. Therefore, there are small scattering among optical heads on transmission efficiency of the beam from the laser diode 1 to the information recording medium 5 and on positions of the element 17, the laser diode 1 and the photodetectors 8a and 8b relative to the plate 16, so that the performance of the optical head is stable.

Figure 4:
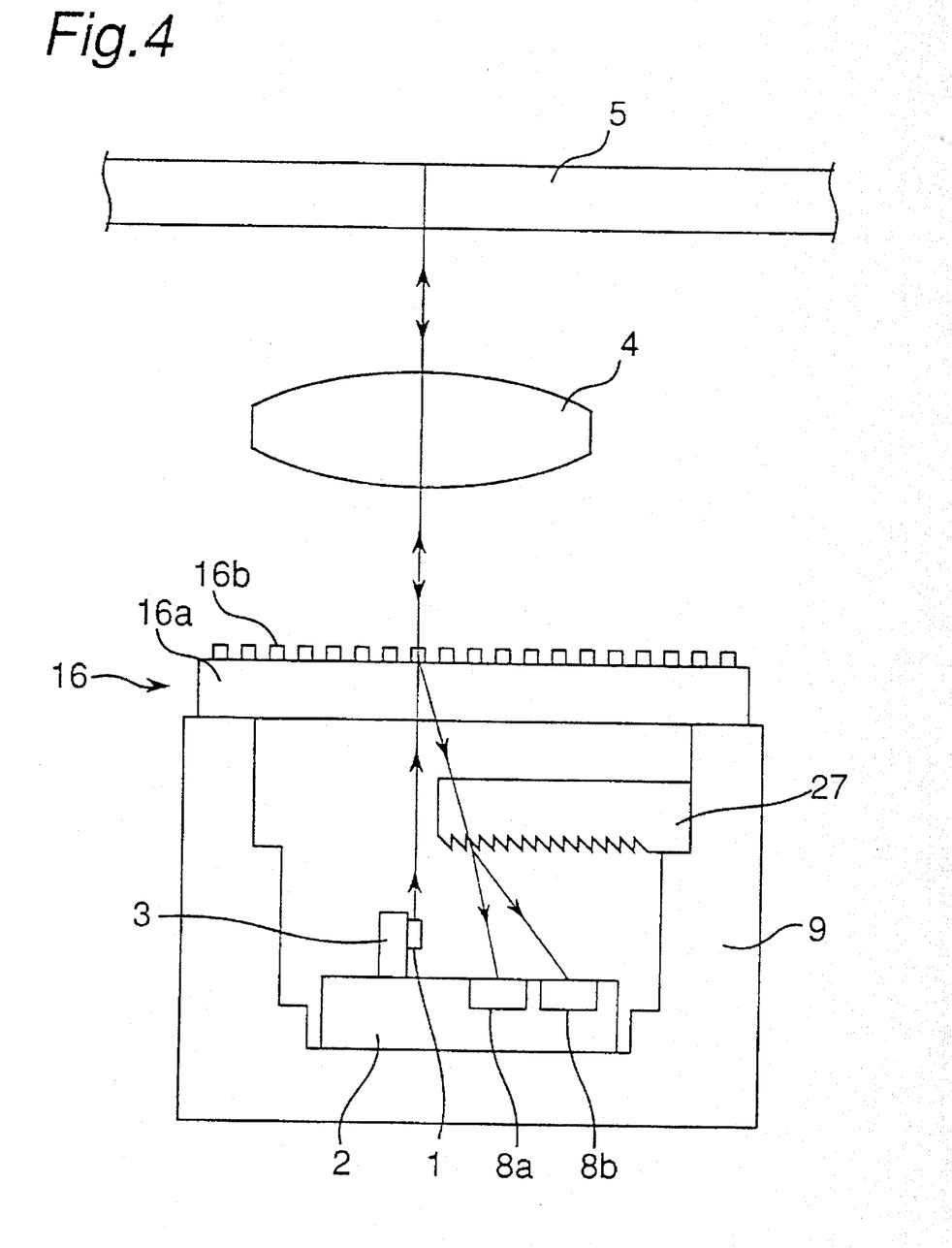
FIG. 4 is a sectional view of an optical head of a fourth embodiment of the invention.

FIG. 4 shows an optical head of a fourth embodiment of the invention. The optical head of the embodiment is different from that of the third embodiment (FIG. 3) only in that a plate beam-splitting element 27 is used instead of the beam-splitting element 17. The plate beam-splitting element 27 has a saw-teeth-like sectional shape on a plane of a transparent plate produced with a press forming process so as to have splitting ratios different between the P and S polarizations similarly to the plate beam-splitting element 17, and it has the same function as the plate 17. That is, the element 27 is not provided in an optical path of the beam emitted from the laser diode 1 to the element 16, while it splits the returned beam split by the element 16 into two beams having polarization planes perpendicular to each other and inclined by 45° to the polarization direction of the beam split by the first element 16.

A basic operation as the optical head is similar to that of the third embodiment, and detail explanation thereof is omitted here. Similarly to the third embodiment, the optical head of this embodiment also have advantages such as compactness, high reliability and durability, easy production thereof and improvement of recording, reproducing and erasing performance. Further, because the plate beam-splitting element 27 comprises a film having a saw-teeth shape for separating polarizations, it can be produced with high productivity at a low cost by using a press forming process. Because the press forming process can be applied to a special material having superior thermal protection or environment-proof, so that the reliability of the optical head is improved.

Figure 5:
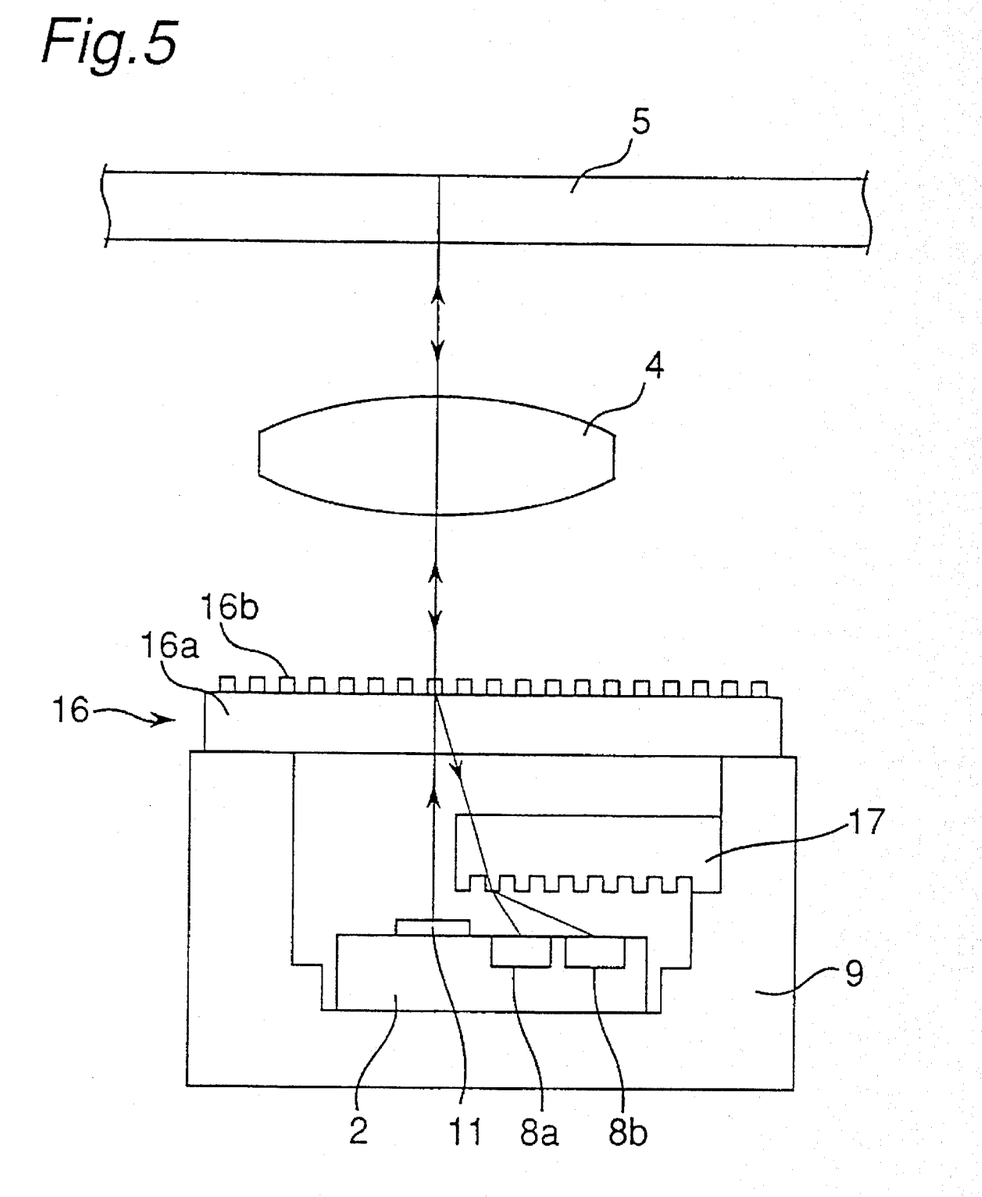
FIG. 5 is a sectional view of an optical head of a fifth embodiment of the invention.

FIG. 5 shows an optical head of a fifth embodiment of the invention. The optical head of the embodiment is different from that of the third embodiment (FIG. 3) only in that a surface emitting laser element 11 on substrate with a micromirror is used instead of the laser diode 1. The surface emitting laser 11 is put directly on the substrate 2. The laser 11 has a light-emitting chip mounted for example on a recess provided in the substrate 2, and the recess has a slope with an angle of 45°. A beam emitted by the chip is reflected by the slope to transmit the beam upwards.

A basic operation as the optical head is similar to that of the third embodiment, and detail explanation thereof is omitted here. Similarly to the third embodiment, the optical head of this embodiment also have advantages such as compactness, high reliability and durability, easy production thereof and improvement of recording, reproducing and erasing performance. Because the stem 3 for mounting the laser diode 1 is omitted, the thickness of the optical head can be decreased further. Because the surface emitting laser 11 is put directly on the substrate 2, electrical connection between the laser 11 and the substrate 2 becomes easy and this reduces the cost further.

Figure 6:
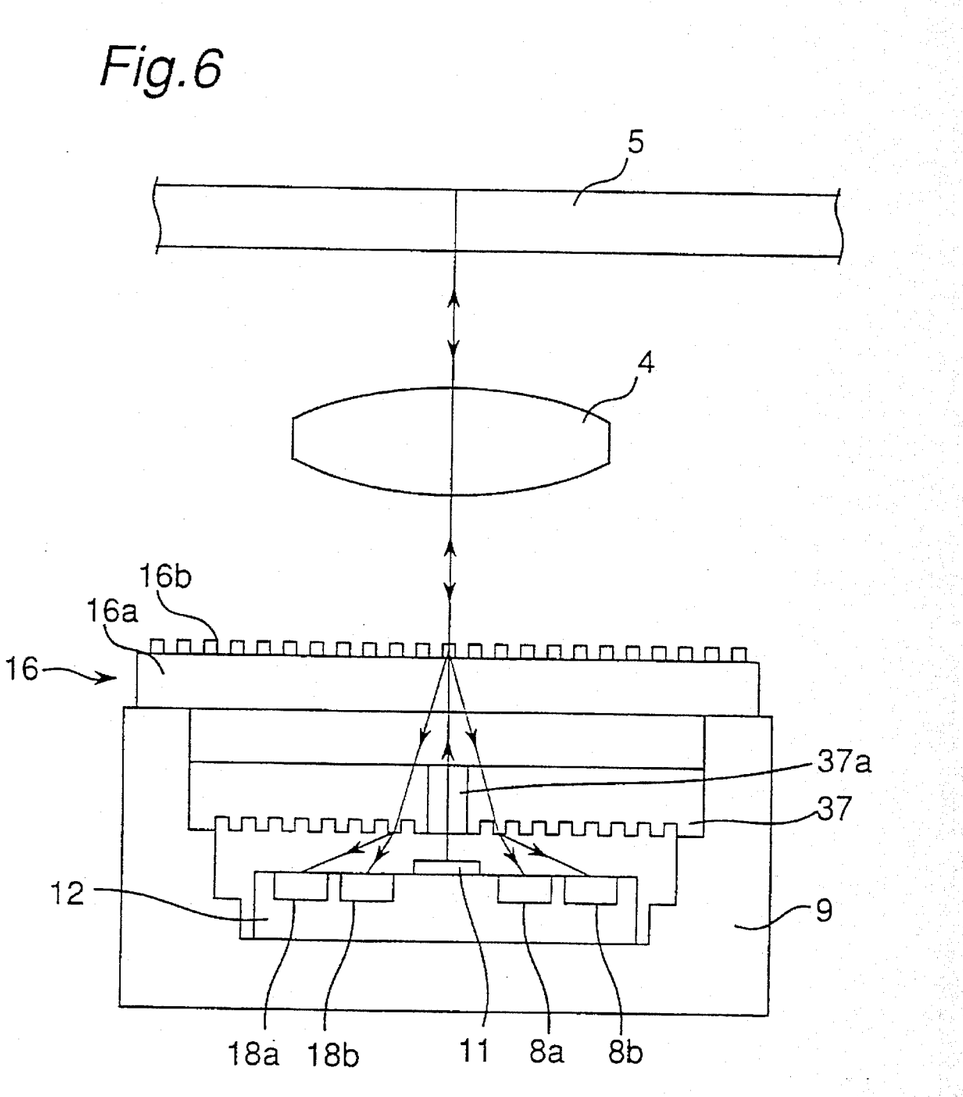
FIG. 6 is a sectional view of an optical head of a sixth embodiment of the invention.

FIG. 6 shows an optical head of a sixth embodiment of the invention. The optical head of the embodiment is different from that of the third embodiment (FIG. 3) as follows: First, a plane beam-splitting element 37 having an opening at the center thereof 37a is provided instead of the plane beam-splitting element 17. Second, a second pair of photodetectors 18a and 18b as well as a pair of photodetectors 8a and 8b is formed in a substrate 12 at positions symmetrical to those of the photodetectors 8a and 8b. Third, a surface emitting laser 11 is used instead of the laser diode 1 and the stem 3.

A basic operation as the optical head is generally similar to that of the third embodiment. The beam emitted from the laser 11 enters directly into the plane beam-splitting element 16. Two beams split by the plane beam-splitting element 16 enter the plane beam-splitting element 37, and the element 37 splits a part of each of the returned beams into two beams by a very small angle. The beams are split symmetrically with respect to the beam returning to the laser 11. Thus, the split beams are detected by two pairs of the photodetectors 8a, 8b and 18a, 18b. Thus, the direction of rotation of the polarization plane of the linearly polarized light is detected to get information signals by calculating the observed signals with the photodetectors, for example, by obtaining a difference between a sum of the signals of the photodetectors 8a and 18b and that of the photodetectors 8b and 18a.

Similarly to the first embodiment, the optical head of this embodiment also had advantages such as compactness, high reliability and durability, easy production thereof and improvement of recording, reproducing and erasing performance. Because the two pairs of the photodetectors can detect the beams, a total amount of incident light increases, so that precision of information reproduction is improved further. Further, because the light can be used efficiently, a light-emitting element of a lower cost can be used.

Figure 7:
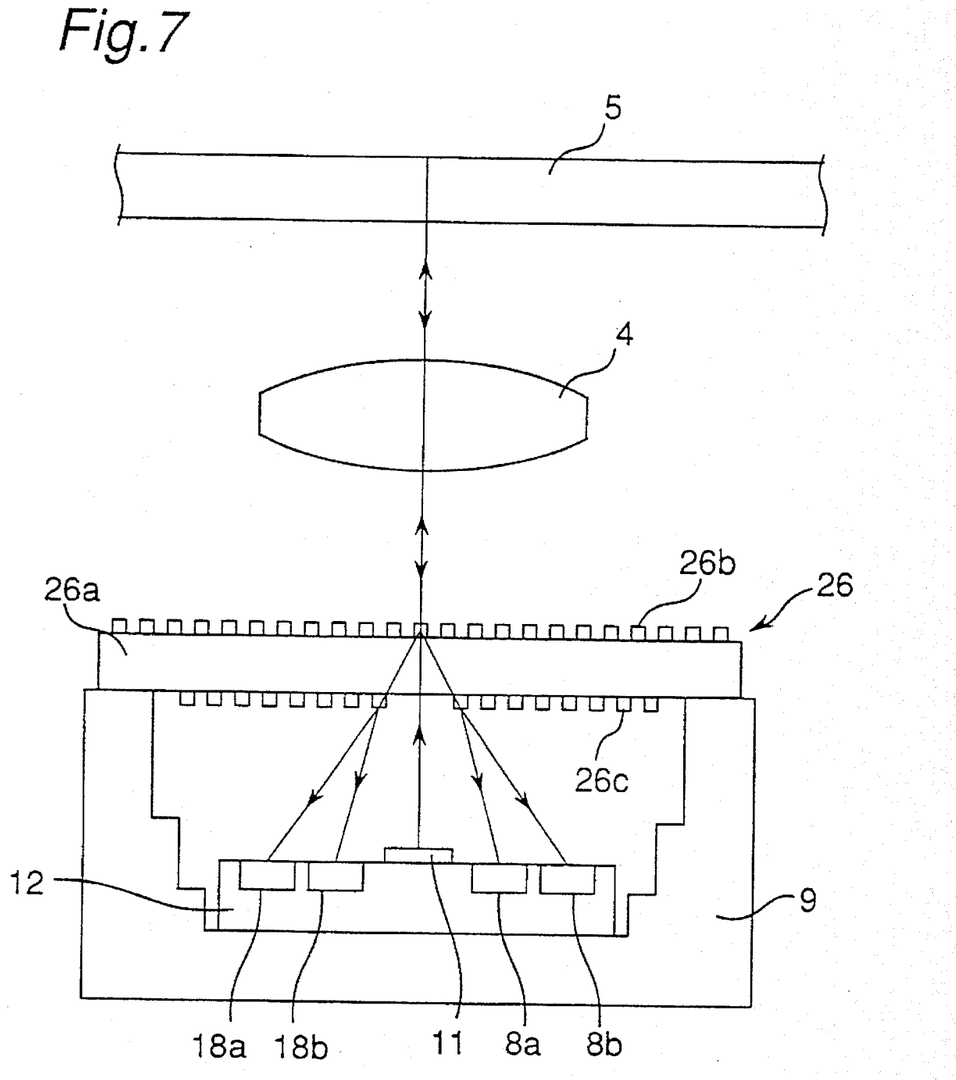
FIG. 7 is a sectional view of an optical head of a seventh embodiment of the invention.

FIG. 7 shows an optical head of a seventh embodiment of the invention. The optical head is different from that of the sixth embodiment (FIG. 6) in that a single plate beam-splitting element 26 is used instead of the two beam-splitting elements 16 and 37 so as to have the functions of the two elements. That is, the plate beam-splitting element 26 comprises a transparent plate 26a and first and second optically anisotropic films 26b, 26c, for separating polarizations, opposed to an information recording medium 5 and to a substrate 11, respectively. The first film 26b is deposited on a plane of the transparent plate 26a so as to have a shape similar to a grating. The first film 26b has splitting ratios different between S and P polarizations similarly to the first plate beam-splitting element 16 shown in FIG. 3, and it has the same function as the element 16. That is, a part of the beam emitted by the surface emitting laser 11 transmits the film 26b towards the information recording medium 5 and splits the beam reflected by the medium 5 into two directions different by a very small angle from that of the beam returning to the laser 11. Further, the second film 26c is deposited on a the other plane of the transparent plate 26a so as to have a shape similar to a grating except a region through which the beam from the laser 11 transmits. The second film 26c splits the returned beam split by the first film 26b into at least two beams having polarization planes perpendicular to each other. The plate beam-splitting element 26 is mounted to a housing 9 so as to seal the substrate 12.

Similarly to the first and sixth embodiments, the optical head of this embodiment also have advantages such as compactness, high reliability and durability, easy production thereof and improvement of recording, reproducing and erasing performance. Further, because the plate beam-splitting element has functions of two polarization separations, the optical head becomes more compact. A process for adjusting the positions of the components of the optical head can be reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An optical had comprising:
    a light emitting element for emitting a beam;
    a condensing element for condensing a beam onto an information recording medium and for transmitting the beam reflected by the information recording medium;
    a first plate beam-splitting element having a first optical element,
    said first beam-splitting element transmitting at least a part of a beam entering vertically from said light emitting element towards said condensing element,
    said first optical element having a splitting ratio for P polarization different from that for S polarization,
    said first optical element splitting at least a part of a beam reflected by the information recording medium and entering to said first optical element at a side thereof opposing said condensing element, the beam split by said first optical element propagating along a direction different from that of the beam entering said first optical element;
    a second plate beam-splitting element comprising a second optical element provided between said first plate beam-splitting element and said light emitting element in parallel to the first optical element of said first plate beam-splitting element,
        said second plate beam-splitting element being arranged so that the beam emitted by said light emitting element enters vertically to said second optical element,
        said second optical element splitting the beam having been reflected by the information recording medium and having been split by said first optical element along the direction different from that of the beam entering said first optical element into at least two beams having polarization planes perpendicular to each other;
    a pair of photodetectors for detecting beams provided at positions to detect the beams split by said second beam-splitting element.

2. The optical head according to claim 1, further comprising a housing for enclosing said light emitting element, said pair of photodetectors and said second plate beam-splitting element, wherein said first plate beam-splitting element seals the housing.

3. The optical head according to claim 1, wherein said light-emitting element and said photodetectors are provided on the same substrate.

4. The optical head according to claim 3, further comprising a housing for enclosing said substrate and said second plate beam-splitting element, wherein said first plate beam-splitting element seals the housing.

5. The optical head according to claim 1,
    wherein said second plate beam-splitting element is located at a position not included in an optical path of the beam emitted from said light-emitting element to said condensing element, but included in an optical path of the beam transmitted by said condensing element and split by the first optical element of said first plate beam-splitting element along the direction different from that of the beam entering said first optical element.

6. The optical head according to claim 1, wherein at least one of said first and second beam-splitting plates comprises an optical film formed on a transparent plate, the optical film having a grating pattern along a particular direction for separating polarizations.

7. The optical head according to claim 1, wherein at least one of said first and second beam-splitting plates comprises a portion having grooves formed in parallel along a particular direction, the grooves having sections of a saw teeth pattern.

8. The optical head according to claim 1, wherein said light emitting element comprising a surface emitting laser element on substrate with a micro-mirror.

9. The optical head according to claim 1, further comprising a second pair of photodetectors for detecting beams provided at positions to detect beams split by said second beam-splitting element, the positions of the second pair of photodetectors being different from said pair of photodetectors, wherein said first optical element splitting at least a part of a beam entering to said first optical element at a side thereof opposing to said condensing element into two beams, the two beams split by said first optical element propagating along two directions different from that of the beam entering said first optical element, the two directions being symmetrical to the beam entering said first optical element, said second plate beam-splitting element splitting the two beams split by said first plate beam-splitting element each into at least two beams having polarization planes perpendicular to each other to be guided onto two pairs of photodetectors.

10. The optical head according to claim 9, wherein said second plate beam-splitting element has a through-hole to transmit the beam emitted from said light emitting element to said condensing element.

11. An optical head comprising:

a light emitting element for emitting a beam;

a condensing element for condensing the beam onto an information recording medium;

a plate beam-splitting element comprising a first splitting element formed on a plane thereof opposing said condensing element and a second splitting element formed on another plane thereof opposing said light emitting element, the first splitting element having a splitting ratio for P polarization different from that for S polarization, the first splitting element transmitting at least a part of the beam emitted by said light emitting element to said condensing element, said first splitting means splitting at least a part of the beam reflected by the information recording medium and transmitting said condensing element along a direction different from that of a direction returning to said light emitting element, the second splitting element splitting the beam split by the first splitting element into at least two beams having polarization planes perpendicular to each other; and a pair of photodetectors for detecting beams guided by said plate beam-splitting element.

12. The optical head according to claim 11, further comprising a second pair of photodetectors for detecting beams provided at positions to detect beams split by said second splitting element, the positions of the second pair of photodetectors being different from said pair of photodetectors, wherein said first splitting element splitting at least a part of a beam entering to said plate beam-splitting element at a side thereof opposing to said condensing element into two beams, the two beams split by said first splitting element propagating along two direction different from that of the beam entering said first splitting element, the two directions being symmetrical to the beam entering said first splitting element, said second splitting element splitting the two beams split by said first splitting element each into at least two beams having polarization planes perpendicular to each other to be guided onto two pairs of photodetectors.

* * * * *